(12) United States Patent
Ngo et al.

(10) Patent No.: US 7,061,265 B2
(45) Date of Patent: Jun. 13, 2006

(54) CIRCUIT FOR CONTROLLING LEAKAGE

(75) Inventors: Hung C. Ngo, Austin, TX (US); Jente B. Kuang, Austin, TX (US); Kevin J. Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 10/916,980

(22) Filed: Aug. 12, 2004

(65) Prior Publication Data

US 2006/0033531 A1 Feb. 16, 2006

(51) Int. Cl.
*H03K 19/03* (2006.01)
(52) U.S. Cl. .......................................... 326/26; 326/83
(58) Field of Classification Search ................. 326/83, 326/81, 26, 27
See application file for complete search history.

(56) References Cited

U.S. PATENT DOCUMENTS

| 6,232,793 B1 * | 5/2001 | Arimoto et al. | 326/34 |
| 6,980,018 B1 * | 12/2005 | Ngo et al. | 326/26 |

* cited by examiner

*Primary Examiner*—Vibol Tan
(74) *Attorney, Agent, or Firm*—Richard F. Frankeny; Winstead Sechrest & Minick P.C.; Casimer K. Salys (57) ABSTRACT

Leakage current in logic circuitry is managed by coupling and decoupling the voltage potentials of the power supply from circuitry with large high leakage devices. Driver circuits comprise a low leakage logic path for holding logic states of the output. A high leakage logic path in parallel with the low leakage logic path is used to assert each logic state in the forward direction from input to output. The large output device in each high leakage path that enhances the current drive of a logic state on the output are leakage stress relieved by allowing their drive inputs to collapse after the output logic state has been asserted. The high leakage logic paths employ multiple stages with collapsing logic states that are generated in response to asserted logic states on the output and logic states of the low leakage logic path thus reducing the device sizes needed to control leakage.

20 Claims, 11 Drawing Sheets

CIRCUIT FOR CONTROLLING LEAKAGE

GOVERNMENT RIGHTS

This invention was made with Government support under NBCH30390004 awarded by PERCS II research program. The Government has certain rights in this invention.

TECHNICAL FIELD

The present invention relates in general to complementary metal oxide semiconductor (CMOS) circuits and, in particular, to circuit methodologies for reducing leakage in sub-100 nm technologies.

BACKGROUND INFORMATION

Oxide tunneling current in metal oxide silicon (MOS) field effect transistors (FET) is a non-negligible component of power consumption as gate oxides get thinner, and may in the future become the dominant leakage mechanism in sub-100 nm complementary MOS (CMOS) circuits. The gate current is dependent on various conditions for a single transistor and three main static regions of operation may be identified for a MOSFET. The amount of gate-leakage current differs by several orders of magnitude from one region to another. Whether a transistor leaks significantly or not is also affected by its position in relation to other transistors within a CMOS circuit structure as this affects the voltage stress to which a particular device is subjected.

The three region of operation are a function of applied bias if one only considers the parameters that affect the magnitude of gate current in a MOSFET as it operates in relation to other MOSFETs. Assuming that the supply voltage (Vdd) and the threshold voltage (Vt) are fixed, then a MOSFET in a static CMOS logic gate operates in one to three regions, each with a significantly different amount of gate leakage.

The first region is called "strong inversion" and is the region where a MOSFET operates with the absolute value of the gate to source voltage (|VGS|) equal to Vdd. The gate-leakage current density for an N-channel FET (NFET) in strong inversion may be as high as $10^3$ amperes square centimeter ($A/cm^2$) for an oxide thickness of 1.5 nanometers (nm) at Vdd equal to 3 volts (V). For such a thin oxide, a more realistic value for Vdd is 1.2 V, in which case the gate-leakage current would more likely be 20 $A/cm^2$.

The second region is called the "threshold" region where |VGS|=Vt. A MOSFET operating in the threshold region will leak significantly less than one operating in the strong inversion region, typically 3 to 6 orders of magnitude less depending on Vdd and the oxide thickness.

The third region is called the "Off" region where |VGS|=0.0 V. For an NFET operating in the Off region, there is no leakage if the drain voltage (Vd)=0.0 V. However, if Vd is equal to Vdd, then a small leakage current in the reverse direction (drain to gate) may be present due to gate-drain overlap area. Of course, this current depends on transistor geometry and is typically 10 orders of magnitude less than the gate-leakage current in the strong inversion region.

The above three regions represent three distinct conditions or states for the channel of a MOSFET. Whether an "ON" transistor operates at strong inversion or at threshold is determined by its position inside a logic circuit structure as well as by the state of other transistors in the circuit structure.

Both NFETs and P-channel FETs (PFETs) in a logic circuit structure operate in one of the three regions described above. However, the main tunneling current in a PFET device in strong inversion is due to hole tunneling from the valence band and the main tunneling current in an NFET device in strong inversion is due to electron tunneling from the conduction band. Because of this, PFET gate currents are about 10 times smaller than equivalent sized NFET devices. This fact is important in assessing gate-leakage in a static CMOS circuit.

Since gate leakage currents are measured as current density, it follows that the gate-leakage current in a MOSFET is directly proportional to the gate area (width times length). Transistor sizing, therefore, has a direct impact on the amount of gate-leakage in a CMOS logic circuit.

As CMOS circuits become smaller, leakage current that results when voltage is applied to the gate of the field effect transistors becomes a significant portion of the power dissipation. Leakage power may become the limiting factor in how small devices may be manufactured. As devices are made smaller, the power supply voltage is correspondingly reduced. However, this may not achieve an adequate reduction in leakage power dissipation. Alternate techniques are being employed to reduce leakage power. One popular technique is to use power-gating to isolate the power supply voltage in groups of circuits at controlled times. These circuits are sometimes referred to as being part of a power-gated domain. Other circuits may be evaluating a logic function and may not be in a power-gated domain. Interfacing between circuits in a power-gated domain and circuits in a non-power-gated domain may prove difficult. The state of an output from a power-gated domain may be uncertain during the time period of power-gating. While the benefits of power-gating are known, there is no consensus on strategies to preserve logic states of outputs in the power-gated domains. Since power-gated domains may be variable, the method of preserving output logic states from circuits in a power-gated domain are controlled by the power-gating control signals themselves.

The current drive capability of a CMOS buffer depends on the channel size of devices used to drive outputs or to drive many other logic gate inputs. Therefore, one would expect the large devices to exhibit large gate-leakage current when the technology has gate oxides that are very thin. Likewise, logic regions with a high number of logic gates may exhibit a large gate-leakage current due to the large number of devices that are in strong inversion at any one static time (between clock transitions). Logic regions with a high number of logic gates may employ power supply gating whereby the power to the logic devices are decoupled by the action MOSFETs, PFETs for the positive power supply voltage and NFETs for the negative power supply voltage. These regions where power supply gating is employed is sometimes referred to as "cuttable" regions. When a cuttable region is interfaced with a non-cuttable region, then logic states at the interface outputs may become indeterminate when power is decoupled.

By providing feedback from the output of a power-gated or cuttable circuit, the circuit can be automatically power-gated after the output logic state has been established. This may be done by gating the stage that provides the drive to the power-gated output device with the proper phase of the output. Sometimes it is desirable to control the time from when a logic state is asserted on the output until power-gating is activated to reduce leakage. Allowing additional time between the assertion of an output logic state and power-gating enables the use of smaller device sizes.

There is, therefore, a need for a circuit design for low leakage circuits that enables automatic decoupling of leakage stressed devices with a time delay between the assertion of an output logic state and when the leakage stressed devices are power-gated.

SUMMARY OF THE INVENTION

The drive circuit used to provide current to a heavily loaded node makes use of a low leakage logic path between the input and driver output to provide a holding function. The output has large high current drive devices in parallel with the output of the low leakage path to quickly charge and discharge the driver output in the forward direction. The large devices providing the pull-up and pull-down functions are driven by high leakage logic paths in parallel to the low leakage logic path. The high leakage logic paths are power-gated such that the voltage on the gate of the output device providing a first logic state is floated in steady state, wherein the asserted output logic state is held by the action of the low leakage logic path. The output device providing the second logic state is degated and is OFF when the output is in the first logic state. When the input transitions from the existing logic state providing the first logic state output, the forward signal propagates through the low leakage logic path and the high leakage logic path turning ON the output device providing current drive for the second logic state. The second logic state on the output is then coupled with feedback back to the high leakage path input stages providing power-gating where the potentials of the power supply are progressively decoupled from stages of the high leakage path providing the drive for the second logic state on the output. The outputs of the stages of the high leakage logic path collapse to a "floating" state and the collapsing states propagate from the input stage to the gate of the output device providing the second logic state. In this manner, the large output devices are stress relieved allowing leakage current to be reduced. By propagating the collapsing state over several stages allows the device sizes of the high leakage logic paths to be reduced. Switching from a high leakage state to a low leakage state in a circuit employing embodiments of the present invention occurs over a relatively long time relative to forward logic speeds. Circuitry employing propagating collapsing states may be used in a variety of circuit topologies to reduce leakage current.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

In the following detailed description, a collapsing logic state is one that transitions from its asserted state towards the opposite floating state in response to decoupling one of the power supply potentials from the circuit stage asserting the logic state. Thus, an asserted logic zero would float "up" towards a logic one when the ground potential is decoupled from the device asserting the logic zero. If a collapsing logic zero is coupled to a device initially asserting a logic one, then it may cause a collapsing logic one on the output of the stage receiving the collapsing logic zero. A collapsing logic zero may be represented by the symbol L↑. Likewise, a collapsing logic one may be represented by the symbol H↓.

Also in the following detailed description a logic state refers to a binary value that a node or input or output may experience. For example, a logic zero state is the binary value corresponding to the ground voltage potential of the power supply and a logic one state is the binary value corresponding to the positive voltage potential of the power supply powering logic circuitry. An asserted logic state at a node is a binary value that results from a switching device directly coupling the node to either the positive or ground potentials of the power supply. An asserted logic state is differentiated from a collapsing logic state which is a binary value that results from removing any direct drive of a node and allowing the node to either be charged or discharged (floated) to the binary value with leakage current. For example if a PFET is turned OFF, its drain would tend to float to a logic one due to leakage, likewise if a NFET is turned OFF its drain would tend to float to a logic zero due to leakage.

Refer now to the drawings wherein depicted elements are not necessarily shown to scale and wherein like or similar elements are designated by the same reference numeral through the several views.

Figure 1:
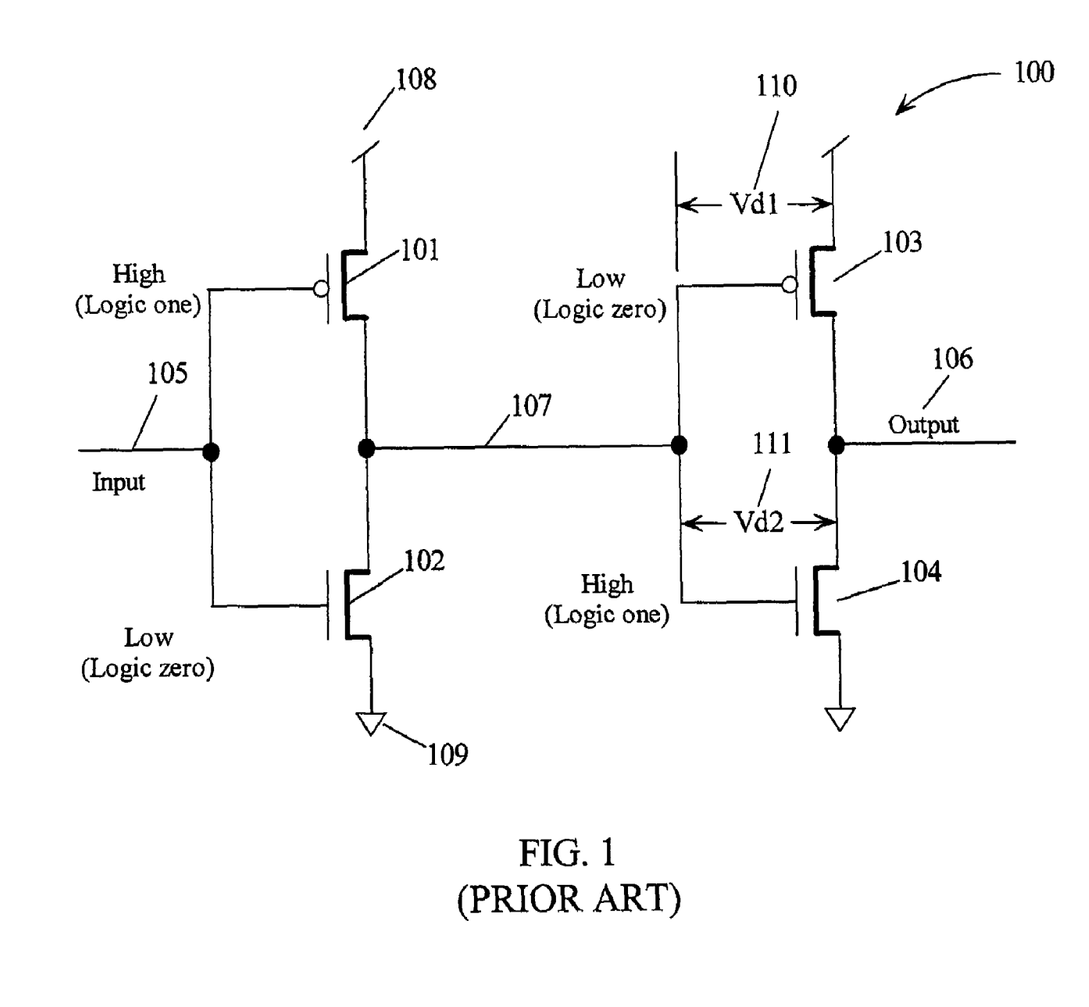
FIG. 1 is a circuit diagram of a prior art buffer illustrating the normal voltage stress that leads to leakage currents.

FIG. 1 is a circuit diagram of a prior art non-inverting buffer 100 comprising two inverting stages. Buffer 100 is coupled to positive power supply potential (Vdd) 108 and negative or ground power supply potential 109. When input 105 is a logic one PFET 101 is OFF and NFET 102 is ON. Intermediate node 107 is a logic zero. When node 107 is a logic zero, voltage Vd1 110 develops across the source to gate of PFET 103. PFET 103 is in the strong inversion region where it will exhibit its highest gate-leakage current. Vd1 110 is very nearly equal to the supply voltage differing only by the magnitude of the voltage across NFET 102 when it is ON. Likewise, when input 105 is a logic zero, PFET 101 is ON, charging node 107 to a logic one generating Vd2 111 across the gate to source of NFET 104. When node 107 is a logic one, NFET 102 is in the strong inversion region and will exhibit its highest gate-leakage current. Again, Vd2 111 is very nearly equal to Vdd 108. In a normal buffer design, buffer 100 would employ larger devices for PFET 103 and NFET 104 as these stages provide the output drive capabilities. While PFET 101 and NFET 102 both alternatively operate in the strong inversion region depending on the logic state of input 105, as smaller devices they will exhibit lower gate-leakage than PFET 103 and NFET 103, respectively.

Figure 2:
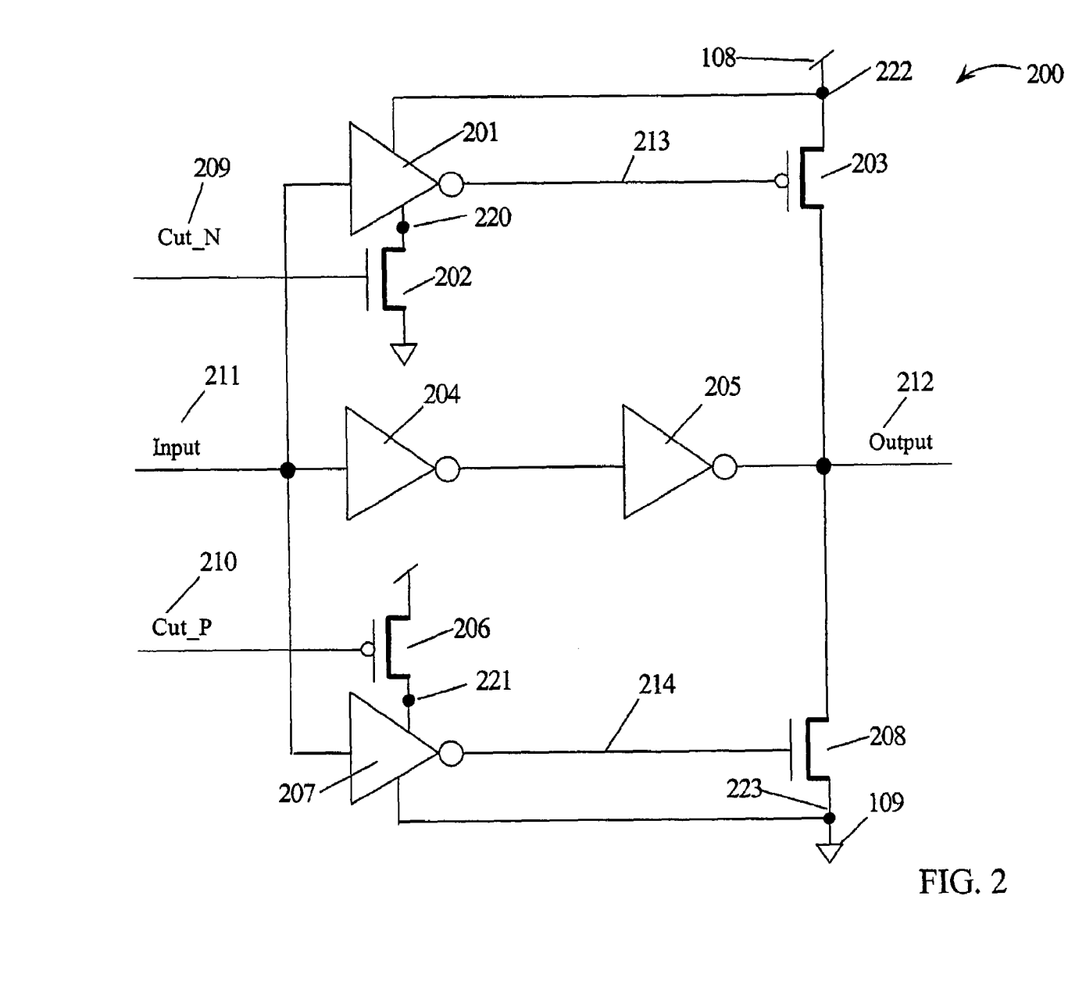
FIG. 2 is a circuit diagram of a buffer/driver with leakage stress relief devices.

FIG. 2 is a circuit diagram of a buffer 200 with power-gating for leakage stress relief. Buffer 200 has an output stage comprising PFET 203 and NFET 208 in parallel with output inverter 205. PFET 203 is gated ON and OFF by the voltage level on node 213 driven by inverter 201. Inverter 201 has power supply node 222 coupled to the positive power supply potential and power supply gating applied to the ground potential via NFET 202 coupled to power supply node 220. NFET 202 is turned ON and OFF with control signals Cut_N 209. The input of inverter 201 is coupled to input 211. If input 211 is a logic one, then node 213 can only be driven to a logic zero if Cut_N 209 is a logic one turning ON NFET 202. IF Cut_N 209 is a logic zero and input 211 is a logic one, then node 213 "floats" reducing the voltage stress on PFET 203 that produces gate-leakage current. When a node floats, its asserted logic state is termed a collapsing logic state as leakage current will cause the node to charge from its previous asserted state towards the opposite logic state.

NFET 208 is gated ON and OFF by the voltage level on node 214 driven by inverter 207. Inverter 207 is coupled to the ground potential of the power supply and has power supply gating applied to the positive voltage via PFET 206 coupled to power supply node 221. PFET 206 is turned ON and OFF with control signal Cut_P 210. The input of inverter 207 is coupled to input 211. If input 211 is a logic zero, then node 214 can only be driven to a logic one if Cut_P 210 is a logic zero turning ON PFET 206. If Cut_P 210 is a logic one and input 211 is a logic zero, then node 214 "floats" reducing the stress on NFET 208.

Inverter 204 and inverter 205 provide the same function as the parallel combination of inverters 201, 207, and PFET 203 and NFET 208 when Cut_N 209 is a logic one and Cut_P 210 is a logic zero. PFET 203 and NFET 208 provide the path for high drive capability for output 212. However, if inverter 201 and inverter 207 are power-gated (via control signals Cut_N 209 and Cut_P 210), inverters 204 and 205 hold the proper logic level on output 212 as nodes 213 and 214 float, reducing the stress on PFET 203 and NFET 208.

Figure 3:
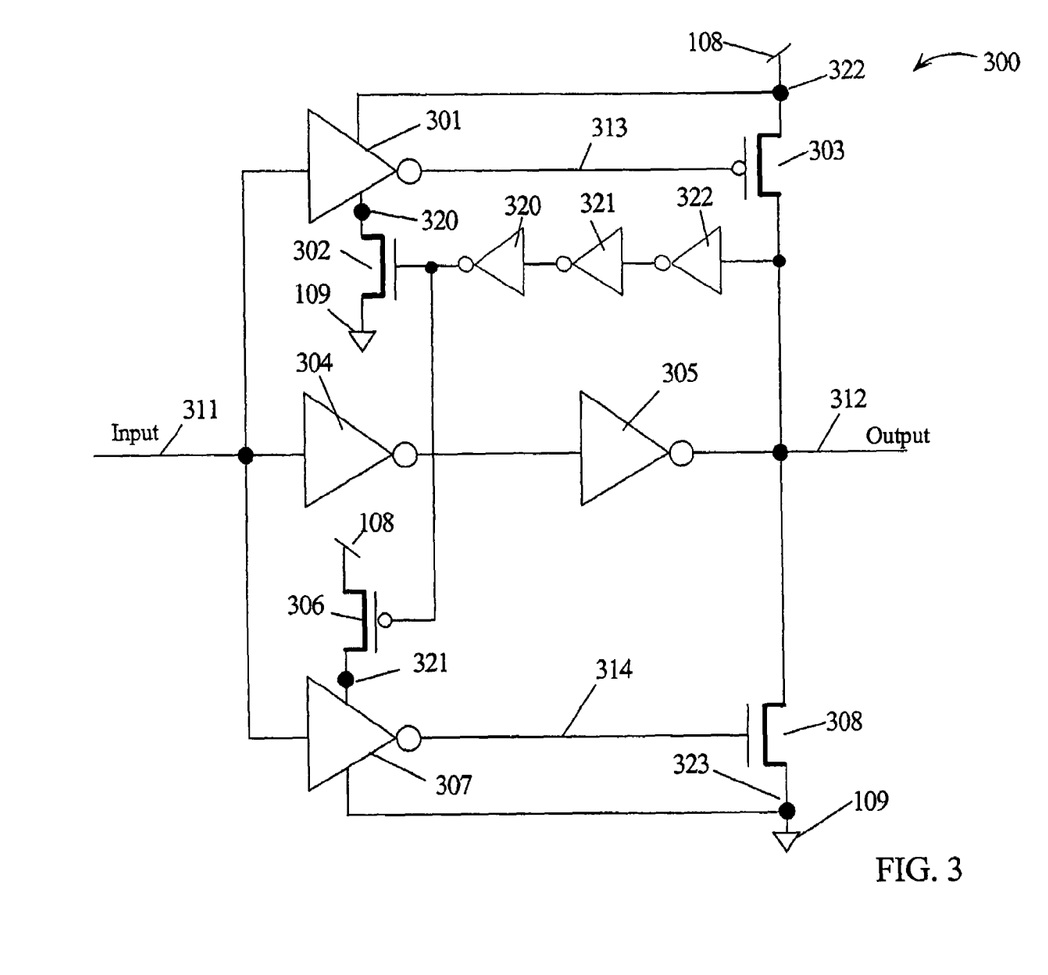
FIG. 3 is a circuit diagram of a driver circuit with automatic self-limiting leakage current control.

FIG. 3 is the circuit diagram of a current driver with self-limiting leakage control employing feedback from the output back to the input stage. Inverters 304 and 305 make up a low leakage logic path and receive input 311 and generate a holding output coupled to output 312 and providing a holding or "keeper" function. Since inverters 304 and 305 are not relied on to provide the dynamic current necessary to drive loads (not shown) coupled to output 312, they both comprise small FET devices with reduced gate leakage when operated in the strong inversion region. Power-gated inverters 301 and 307 are also small as they only drive the gates of PFET 303 and NFET 308, respectively. Power-gated inverter 301 is coupled to the positive voltage potential 108 of a power supply (not shown) via power supply node 322. The ground voltage potential 109 of the power supply is coupled to node 320 of power-gated inverter 301 with NFET 302 in response to the feedback signal on the output of inverter 320 in the feedback path (inverters 320–322). Likewise, power-gated inverter 307 is coupled to the ground voltage potential 109 via power supply node 323. The positive voltage potential 108 is coupled to node 321 of power-gated inverter 307 with PFET 306 in response to the feedback signal on the output of inverter 320 in the feedback path.

Inverter NFET 302 provides the conduction path to pull-down node 313 when gated ON by the feedback circuitry comprising the series connection of inverters 320–322. NFET 302 is also smaller than NFET 308 since it drives only the gate of PFET 303. PFET 306 provides the conduction path to pull-up node 314 when gated ON by the feedback circuitry comprising the series connection of inverters 320–322. PFET 306 is smaller than PFET 303 since it also drives only the gate of single NFET 308.

PFET 303 enhances the logic one drive capability of output 312 when it is turned ON. If output 312 is a logic zero, then the output of inverter 320 is a logic one turning ON NFET 302. When NFET 302 is ON it provides the logic zero drive to the gate of PFET 303 allowing it to turn ON. When input 311 transitions to a logic one, node 313 transitions to a logic zero and PFET 303 turns ON driving output 312 to a logic one. Once output 312 is a logic one, the feedback path via inverters 320–322 turns OFF NFET 302 removing the logic zero drive to node 313 and allowing it to float. Inverters 304 and 305 hold the logic state of output 312 and the leakage stress on PFET 303 is automatically relieved.

NFET 308 enhances the logic zero drive capability of output 312 when it is turned ON. If output 312 is a logic one, then the output of inverter 320 is a logic zero turning ON PFET 306. When PFET 306 is ON, it provides the logic one drive to the gate of NFET 308 allowing it to turn ON. When input 311 transitions to a logic zero, node 314 transitions to a logic one and NFET 308 turns ON driving output 312 to a logic zero. Once output 312 is a logic zero, the feedback path via inverters 320–322 turns OFF PFET 306 removing the logic one drive to node 314 and allowing it to float. Inverters 304 and 305 hold the logic state of output 312 and the leakage stress on NFET 308 is automatically relieved.

Figure 4:
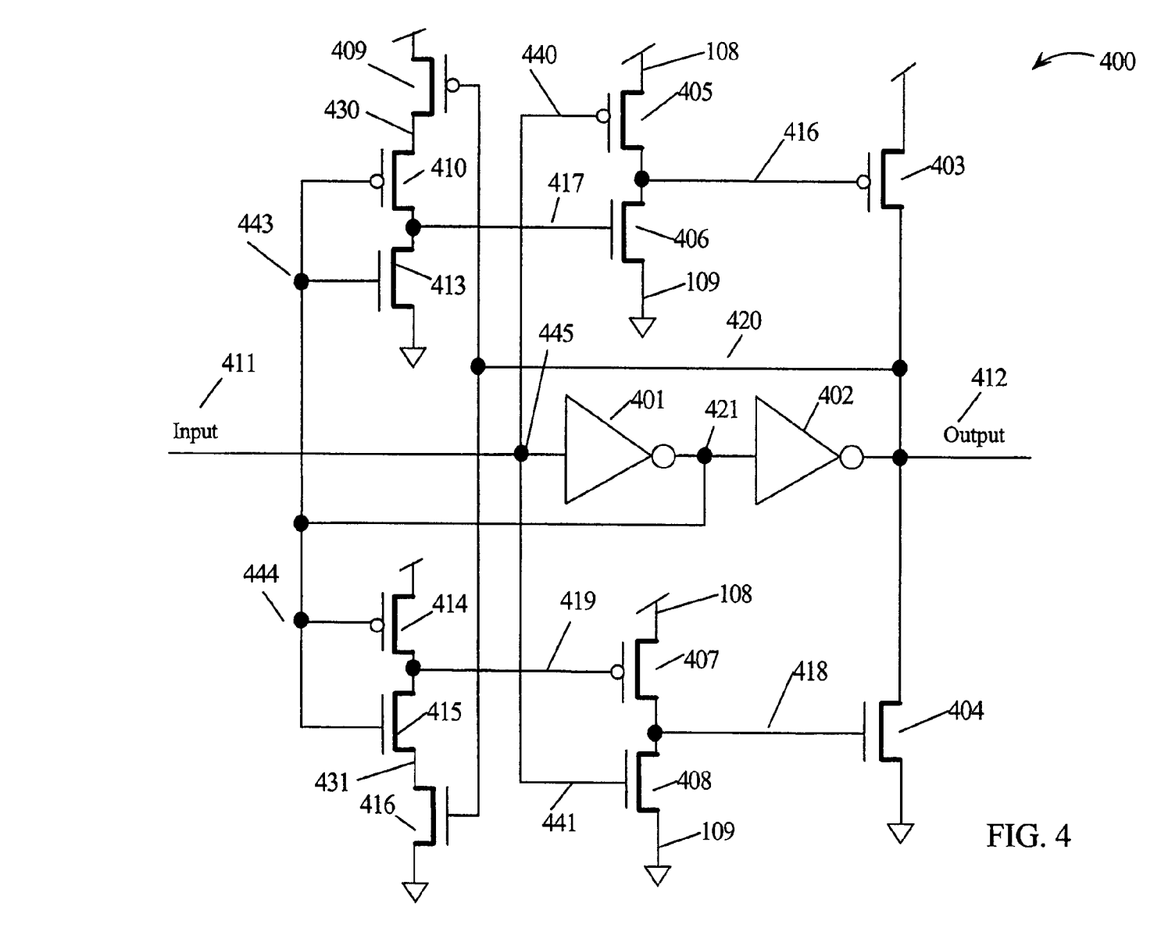
FIG. 4 is a circuit diagram of a non-inverting driver that has parallel high leakage paths with propagating collapsing floating logic states that are automatically controlled by a feedback path according to embodiments of the present invention.

FIG. 4 is the circuit diagram of a non-inverting low leakage driver 400 according to embodiments of the present invention. Low leakage inverters 401 and 402 form the low leakage logic path from input 411 to output 412 and function as holding or keeper devices for output 412. PFET 403 provides enhanced current drive for the logic one logic state of output 412 and NFET 404 provides enhanced current drive for the logic zero state of output 412. PFET 403 and NFET 404 are large devices and as such have increased leakage current.

Driver circuitry 400 is a non-inverting embodiment of the present invention wherein the paths that enhance the output current have twice the number of inverting stages as the forward logic path comprising inverters 401 and 402 and having logic nodes 445 and 421. To assert an enhance logic state on output 412 requires a signal to propagate through inverter 401, through a second stage output 417, a third stage to output 416 and finally through PFET 403 to enhance output 412. The parallel side paths experience four levels of inversion while the forward path experiences only two levels of inversion. This would normally cause a 100% slow down. However, driver 400 still has use where the leakage is a serious problem, output slew rise and fall times need to be acceptable, and a longer delay through the enhancing parallel path can be tolerated or hidden in the design by providing the input signal earlier.

Driver circuitry 400 employs high leakage circuit paths for controlling PFET 403 and NFET 404 and asserting forward logic states on output 412. Additionally, these high leakage circuit paths are configured with propagating collapsing logic states according to embodiments of the present invention and as discussed relative to FIG. 9 and FIG. 10. The first high leakage logic path includes a power-gated inverter comprising PFETs 409–410 and NFET 413 with power node 430, input 443 coupled to logic node 421, output coupled to stage node 417 and a power gating input coupled output 412, an inverting stage comprising PFET 405 and NFET 406 with one input coupled to stage node 417 and a control input 440 coupled to logic node 445, and a driver stage comprising PFET 403. The second high leakage logic path includes a power-gated inverter comprising NFETs 415–416 and PFET 414 with power node 431 input 444 coupled to logic node 421, an output coupled to stage node 419 and a control input coupled to logic node 445, an inverting stage comprising PFET 407 and NFET 408 with one input coupled to stage node 419 and a power gating input coupled to output 412, and a driver stage comprising NFET 404. The power-gated inverters of the first and second high leakage logic paths of driver circuitry 400 have power nodes (430 and 431) that are coupled to the positive and ground voltage potentials respectively with electronic switches (PFET 409 and NFET 416). The high leakage logic paths are designed to assert a forward logic state on node 412 quickly when the input 411 transitions from either a logic one to a logic zero or from a logic zero to a logic one.

Assume that input 411 has been at a logic zero state and the corresponding logic zero state is asserted on output 412. Feedback to node 420 couples the logic zero to the gates of PFET 409 and NFET 416. Therefore, PFET 409 is turned ON and the positive voltage potential 108 is coupled to the inverting stage comprising PFET 410 and NFET 413. Likewise, NFET 416 is turned OFF decoupling the ground voltage potential 109 from the inverting stage comprising NFET 415 and PFET 414. Since input 411 is a logic zero, the output of inverter 401 is a logic one. The output of inverter 401 is an intermediate output and is coupled to the gates of NFETs 413 and 415, and PFETs 410 and 414. Therefore, NFET 413 is turned ON pulling node 417 to a logic zero thus turning NFET 406 OFF. Node 416 is now "floating" and drive PFET 403 is likewise turned OFF. Since input 411 is a logic zero, NFET 408 is OFF. Likewise, since output 412 is a logic zero, NFET 416 is OFF power-gating the drive to PFET 407 causing node 419 to float towards a logic one state thus assuring that PFET 407 is OFF. Both NFET 408 and PFET 407 are OFF in the steady state and thus drive NFET 404 is OFF.

When input 411 transitions to a logic one, the output of inverter 401 transitions to a logic zero. Since PFET 409 is ON (output 412 is still at a logic zero), the logic zero on the output of inverter 401 turns PFET 410 ON and node 417 transitions to a logic one turning ON NFET 406. PFET 405 is turned OFF by input 411 transitioning to a logic one and node 416 is pulled to a logic zero turning ON drive PFET 403. The logic one on input 411 turns ON NFET 408 which in turn pulls node 418 to a logic zero turning OFF NFET 404. Output 412 charges to a logic one with the enhanced current of drive PFET 403. The transition to a logic one by output 412 feeds back and turns OFF PFET 409 decoupling the positive voltage potential 108 from the power-gated first stage causing the logic one of node 417 to become a collapsing logic one thus turning OFF NFET 406 over a delay time period. Since PFET 405 is OFF, the collapsing logic one on node 417 propagates to a collapsing logic zero on node 416 slowly removing the leakage stress on drive PFET 403. Inverters 401 and 402 along with the node capacitance hold the logic one state on output 412.

When input 411 again transitions to a logic zero, the output of inverter 401 transitions to a logic one. Since NFET 416 is ON (output 412 is still at a logic one), the logic one on the output of inverter 401 turns NFET 415 ON and node 419 transitions to a logic zero turning ON PFET 407. NFET 408 is turned OFF by input 411 transitioning to a logic zero and node 419 is pulled to a logic zero turning ON drive PFET 407. The logic one on node 418 turns ON drive NFET 404. The logic zero on input 411 turns ON PFET 405 which in turn pulls node 416 to a logic one turning OFF PFET 403. Output 412 discharges to a logic zero with the enhanced current of drive NFET 404. The transition to a logic zero by output 412 feeds back and turns OFF NFET 416 decoupling the ground voltage potential 109 from the power-gated first stage in the second parallel path causing the logic zero at node 419 to become a collapsing logic zero thus turning OFF PFET 407 over a delay time period. Since NFET 408 is OFF, the collapsing logic zero on node 419 propagates to a collapsing logic one on node 418 slowly removing the leakage stress on drive NFET 404. Inverters 401 and 402 along with the node capacitance hold the logic zero state on output 412.

To increase the amount of delay from an asserted state on output 412 until the drive device (NFET 404 or PFET 403) is stressed relieved, a non-inverting stage may be added in the feedback coupling between output 412 and node 420. For example, two inverters may be added between output 412 and node 420. Likewise, three collapsing stages like circuit 900 and 1000 in FIGS. 9 and 10, respectively, may be used with appropriate logic connections to increase the delay between asserting an output logic state and removing leakage stress on devices coupled to the collapsing logic states.

Figure 5:
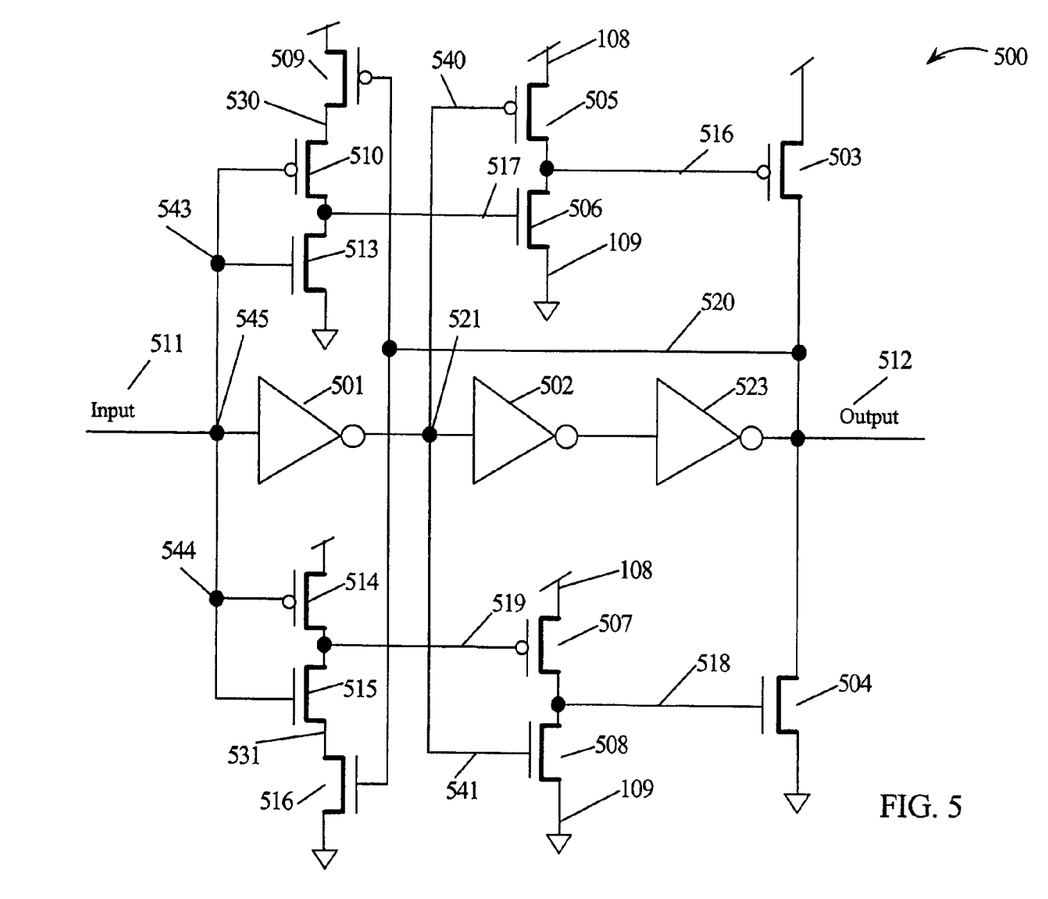
FIG. 5 is a circuit diagram of an inverting driver that has parallel high leakage paths with propagating collapsing floating logic states that are automatically controlled by a feedback path according to embodiments of the present invention.

FIG. 5 is the circuit diagram of an inverting embodiments of the present invention. Low leakage inverters 501, 502, and 523 form the low leakage logic path from input 511 to output 512 and function as holding or keeper devices for output 512. PFET 503 provides enhanced current drive for the logic one logic state of output 512 and NFET 504 provides enhanced current drive for the logic zero state of output 512. PFET 503 and NFET 504 are large devices and as such have increased leakage current.

Driver circuitry 500 employs fast high leakage circuit paths for controlling PFET 503 and NFET 504 and asserting forward logic states on output 512. Additionally, these high leakage circuit paths are configured with propagating collapsing logic states according to embodiments of the present invention and as discussed relative to FIG. 9 and FIG. 10. The first high leakage logic path includes a power-gated inverter comprising PFETs 509–510 and NFET 513 with power node 530, input 543 coupled to logic node 545, an output coupled to stage node 517 and a power gating input coupled output 512, an inverting stage comprising PFET 505 and NFET 506 with an input coupled to stage node 517 and a control input 540 coupled to logic node 521, and a driver stage comprising PFET 503. The second high leakage logic path includes a power-gated inverter comprising NFETs 515–516 and PFET 514 with, power node 531 input 544 coupled to logic node 545, an output coupled to stage node 519 and a control input coupled to logic node 521, an inverting stage comprising PFET 507 and NFET 508 with one input coupled to stage node 519 and a power gating input coupled to output 512, and a driver stage comprising NFET 504. The power-gated inverters of the first and second high leakage logic paths of circuitry 500 have power nodes (530 and 531) that are coupled to the positive and ground voltage potentials respectively with electronic switches (PFET 509 and NFET 516). The high leakage logic paths are designed to assert a forward logic state on node 512 quickly when the input 511 transitions from either a logic one to a logic zero or from a logic zero to a logic one.

Assume that input 511 has been at a logic one state and the corresponding logic zero state is asserted on output 512. Feedback to node 520 couples the logic zero to the gates of PFET 509 and NFET 516. Therefore, PFET 509 is turned ON and the positive voltage potential 108 is coupled to the inverting stage comprising PFET 510 and NFET 513. Likewise, NFET 516 is turned OFF decoupling the ground voltage potential from the inverting stage comprising NFET 515 and PFET 514. Input 511 is coupled to the gates of NFETs 513 and 515 and PFETs 510 and 514. Therefore, NFET 513 is turned ON pulling node 517 to a logic zero thus turning OFF NFET 506. Node 516 is "floating" and drive PFET 503 is likewise OFF. Since input 511 is a logic one, NFET 508 is OFF. Likewise, since output 512 is a logic zero, NFET 516 is OFF power-gating the drive to PFET 507 causing node 519 to float up (towards a logic one state) thus assuring that PFET 507 is OFF. Both NFET 508 and PFET 507 are OFF in the steady state and thus drive NFET 504 is OFF. The logic zero on the output of inverter 501 turns ON PFET 505 thus turning OFF PFET 503. The logic zero on output 512 is held by inverters 501, 502 and 523 and the capacitance of the node.

When input 511 transitions to a logic zero, the output of inverter 501 transitions to a logic one. Since PFET 509 is ON (output 512 is still at a logic zero), the logic zero of input 511 turns PFET 510 ON and node 517 transitions to a logic one turning ON NFET 506. PFET 505 is turned OFF by the output of inverter 501 transitioning to a logic one and node 516 is pulled to a logic zero turning ON drive PFET 503. The logic one of the output of inverter 501 turns ON NFET 508 which in turn pulls node 518 to a logic zero turning OFF NFET 504. Output 512 charges to a logic one with the enhanced current of drive PFET 503. The transition to a logic one by output 512 feeds back and turns OFF PFET 509 decoupling the positive voltage potential 108 from the power-gated first stage causing the logic one at node 517 to become a collapsing logic one thus turning OFF NFET 506 over a delay time period. Since PFET 505 is OFF, the collapsing logic one on node 517 propagates to a collapsing logic zero on node 516 slowly removing the leakage stress on drive PFET 503. Inverters 501 and 502 along with the node capacitance hold the logic one state on output 512.

When input 511 again transitions to a logic one, the output of inverter 501 transitions to a logic zero. Since NFET 516 is ON (output 512 is still at a logic one), the logic one on input 511 turns ON NFET 515 and node 519 transitions to a logic zero turning ON PFET 507. NFET 508 is turned OFF by the output of inverter 501 transitioning to a logic zero and node 519 is pulled to a logic zero turning ON PFET 507. The logic one on node 518 turns ON drive NFET 504. The logic zero on the output of inverter 501 turns ON PFET 505 which in turn pulls node 516 to a logic one turning OFF drive PFET 503. Output 512 discharges to a logic zero with the enhanced current of drive NFET 504. The transition to a logic zero by output 512 feeds back and turns OFF NFET 516 decoupling the ground voltage potential 109 from the power-gated first stage in the second parallel path causing the logic zero node 519 to become a collapsing logic zero thus turning OFF PFET 507 over a delay time period. Since NFET 508 is OFF, the collapsing logic zero on node 519 propagates to a collapsing logic one on node 518 slowly removing the leakage stress on drive NFET 504. Inverters 501 and 502 along with the node capacitance hold the logic zero state on output 512.

To increase the amount of delay from an asserted state on output 512 until the drive device (NFET 505 or PFET 503) is stressed relieved, a non-inverting stage may be added in the feedback coupling between output 512 and node 520. For example, two inverters may be added between output 512 and node 520. Likewise, three collapsing stages like circuit 900 and 1000 in FIGS. 9 and 10, respectively, may be used with appropriate logic connections to increase the delay between asserting an output logic state and removing leakage stress on devices coupled to the collapsing logic states.

While FIGS. 4 and 5 illustrate embodiments of the present invention where the current drive of both logic states of the output (412 and 512) were enhanced with a PFET (403 or 503) and an NFET (404 and 504), it should be clear that only one high leakage path may be used in cases where it is desired to only enhance the current drive of one logic state creating an asymmetrical current drive in the output. This configuration is within the scope of the present invention.

Figure 6:
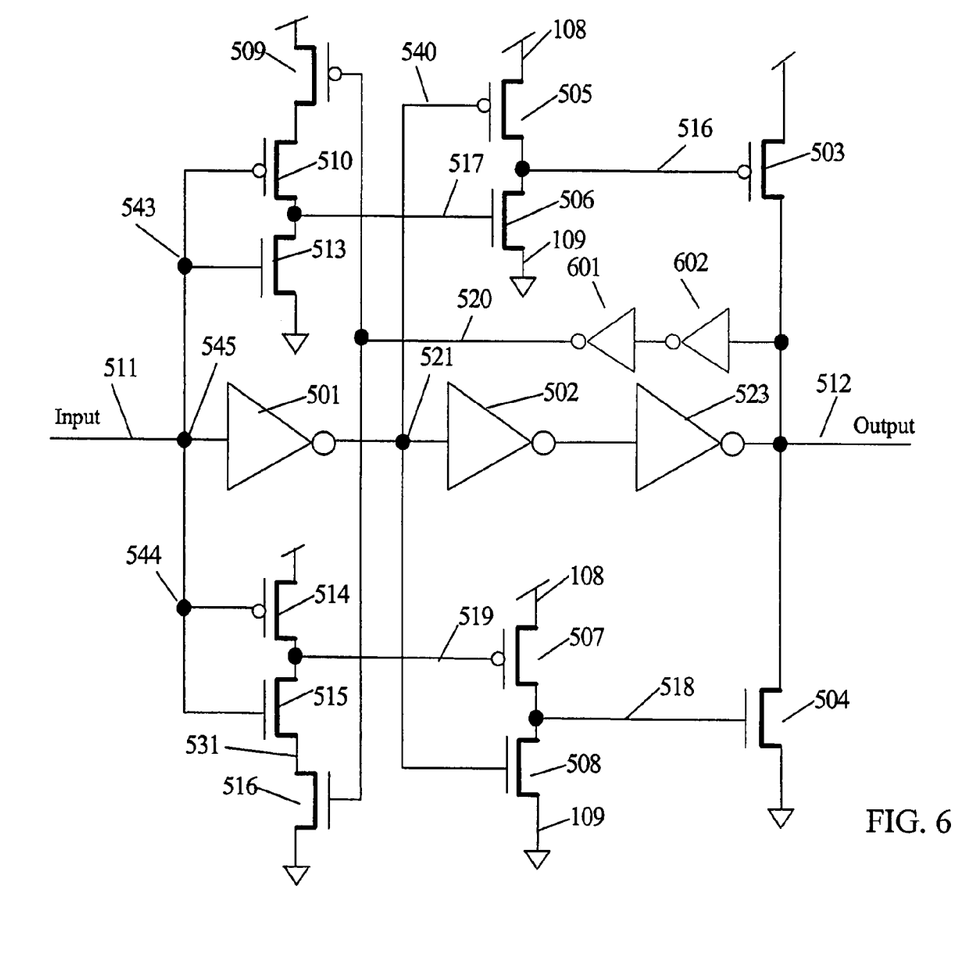
FIG. 6 is a circuit diagram of an inverting driver state that has parallel high leakage paths with propagating collapsing floating logic states that are automatically controlled by a feedback path that has added delay according to embodiments of the present invention.

FIG. 6 illustrates the inverting drive of FIG. 5 with the addition of two inverters 601 and 602 inserted in the feedback path from output 512 to node 520 to increase the delay between an asserted state on output 512 and leakage current stress relieving of the drive devices 503 and 504. In general, delay circuitry may be added to the feedback path as long as it has a non-inverting function (e.g., an even number of logic inverters).

Figure 7:
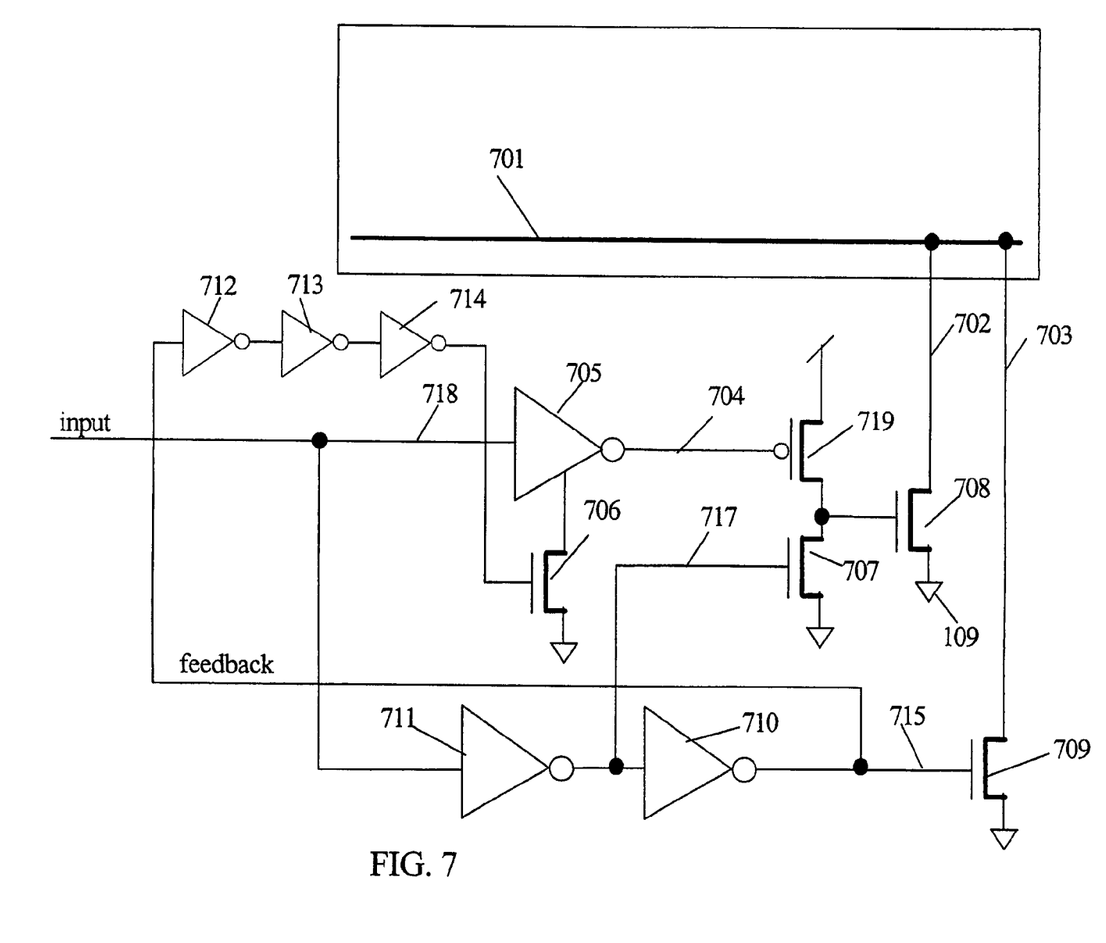
FIG. 7 is a circuit diagram of gate leakage control circuitry used on a power bus according to embodiments of the present invention.

FIG. 7 is a circuit diagram of another embodiment of the present invention where a ground bus 701 is coupled to the ground potential 109 to power-gate a number of logic circuits (not shown) powered by ground bus 701. Nodes 702 and 703 are coupled to the drains of NFETs 708 and 709, respectively. NFETs 708 and 709 are used to couple ground voltage potential 109 to ground bus 701. The two conduction paths afforded by NFET 708 and NFET 709 may be used to relieve the leakage stress of logic circuits powered by ground bus 701.

Inverters 710 and 711 along with NFET 709 provide a low leakage path for coupling ground voltage potential 109 to ground bus 701. When input 718 is a logic zero, the ground bus 701 is disabled, ground voltage potential 109 is decoupled. If input 718 is a logic zero, output 715 is a logic zero turning NFET 709 OFF. Likewise, the logic zero on input 718 asserts a logic one on node 704 turning OFF PFET 719. Since input 718 is a logic zero, the output 717 of inverter 711 is a logic one turning ON NFET 707 which in turn turns OFF NFET 708. Both nodes 702 and 703 are "floating" in this condition.

Input 718 is switched to a logic one to enable ground bus 701. When input 718 transitions to a logic one, output 717 turns OFF NFET 707 and output 715 turns ON NFET 709 coupling ground voltage potential 109 to bus 701. Since node 715 was at logic zero prior to the transition to a logic one by input 718, NFET 706 was turned ON via the inverting feedback path comprising inverters 712–714. The logic one transition on input 718 asserts a logic zero on node 704 turning ON PFET 719 which turns ON NFET 708 enhancing the pull-down of ground bus 701. The transition to a logic one on node 715 that turns ON NFET 709 propagates with the delay of three inverters 712–714 to the gate on NFET 706. Therefore, a delay time after NFET 709 turns ON, NFET 706 is turned OFF decoupling the ground voltage potential 109 from power-gated inverter 705 causing node 704 to float generating a collapsing logic zero. The collapsing logic zero at node 704 propagates as a collapsing logic one at the input of NFET 708 thereby turning OFF NFET 708 a delay time after both NFET 708 and NFET 709 asserted a logic zero state on ground bus 701.

Figure 8:
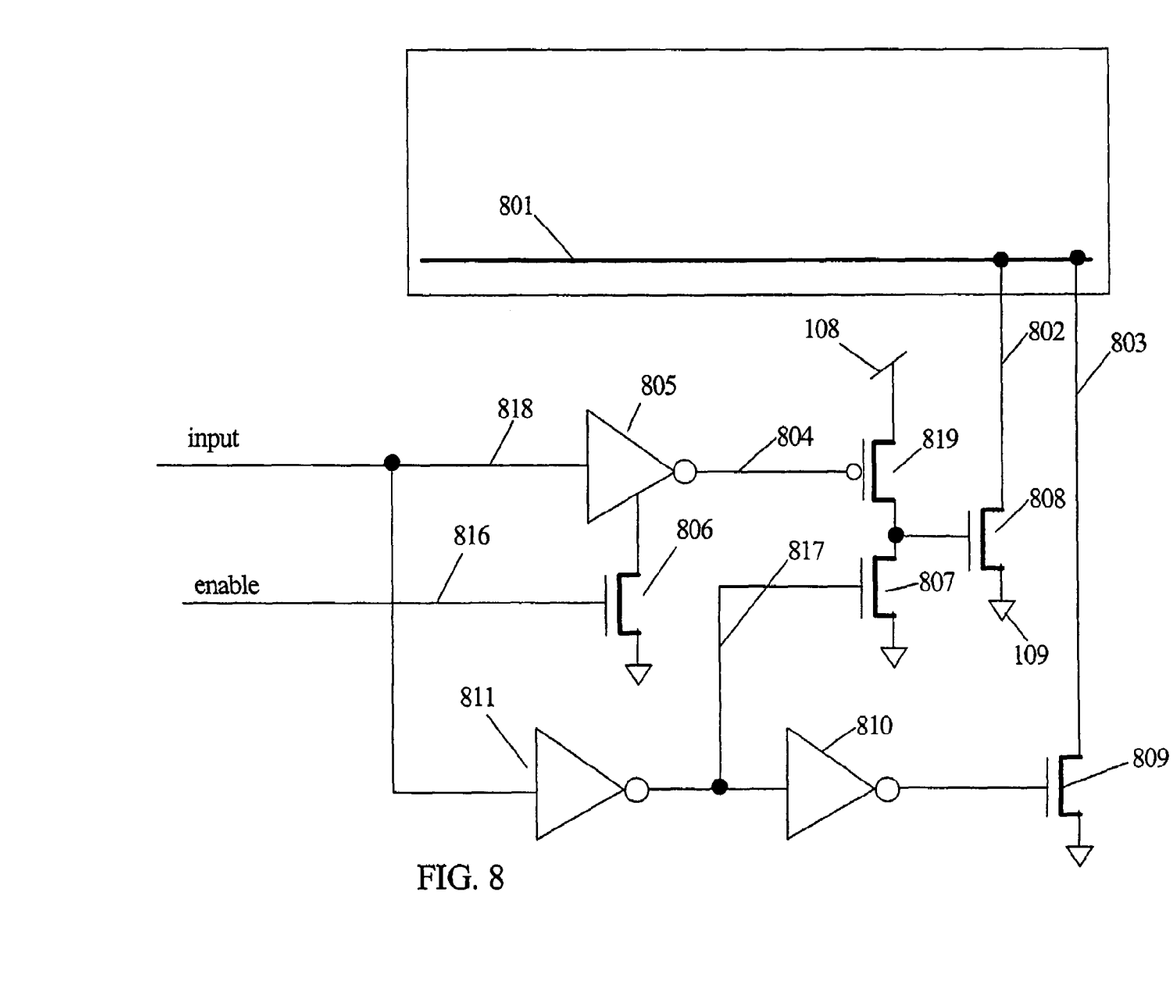
FIG. 8 is a circuit diagram of gate leakage control circuitry used on a power bus according to another embodiment of the present invention.

FIG. 8 is another embodiment of the present invention for relieving the leakage stress on a power-gated ground bus 801. Input 818 provides the ground bus enable signal and input 816 provides the stress relieve control signal. The low leakage logic path comprising inverters 810–811 and NFET 809 are used to couple the ground voltage potential 109 to ground bus 801. Node 803 may be pulled low to a logic zero state by turning ON NFET 809 with a logic one on input 818. The parallel high leakage path comprising power-gated inverter 805, inverting stage comprising NFET 807 and PFET 817, and drive NFET 808 aid in pulling ground bus 801 to a logic zero when input 816 is also a logic one. If leakage stress relief of the high leakage path is desired, then input 816 is set to a logic zero turning OFF NFET 806. This causes the logic zero on node 804 to become a collapsing logic zero. The collapsing logic zero on node 804 propagates to a collapsing logic one on the gate of NFET 808 turning OFF NFET 808 after the delay time generated by the propagating collapsing states.

Figure 9:
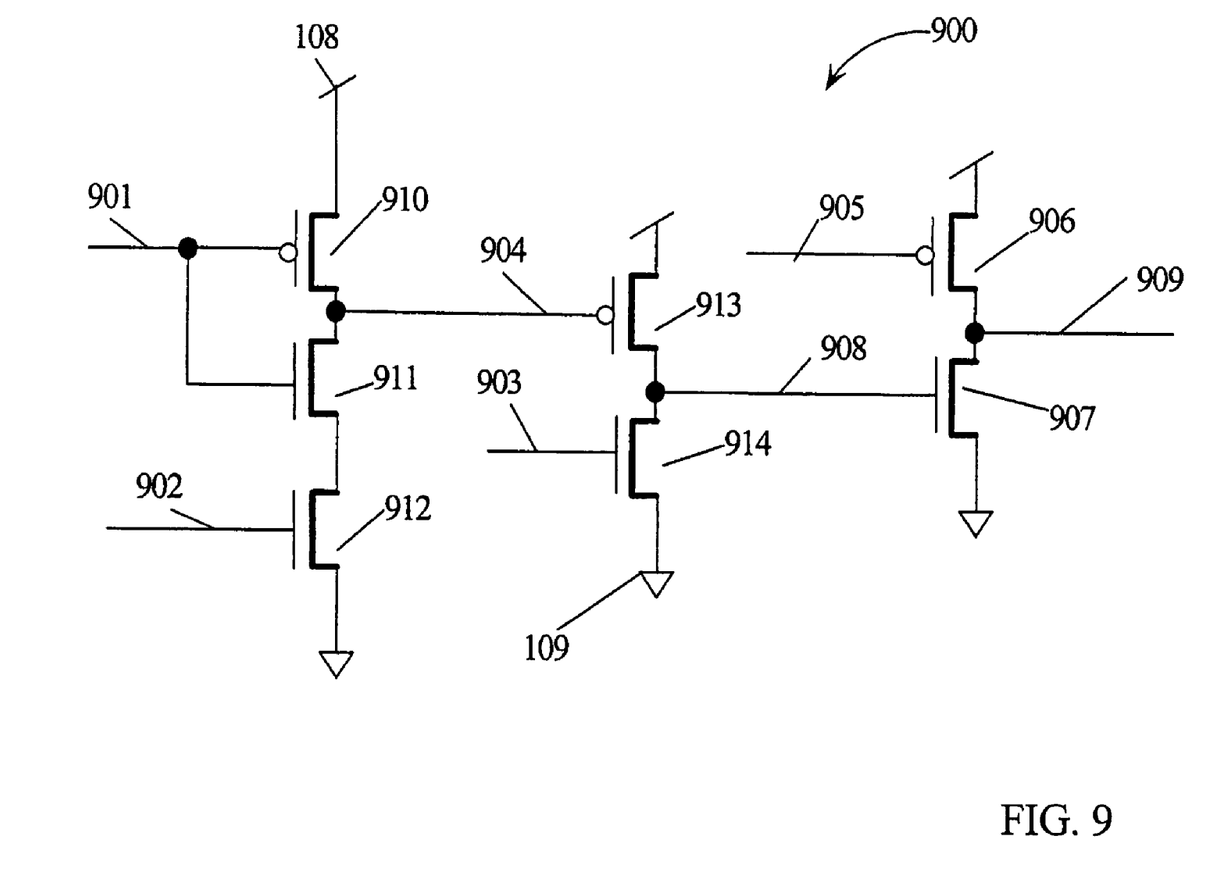
FIG. 9 is a circuit diagram of a high leakage logic path for propagating collapsing floating states according to embodiments of the present invention.

FIG. 9 is a circuit diagram of circuitry 900 for propagating collapsing states according to embodiments of the present invention. The devices are powered by the positive voltage potential 108 and the ground voltage potential 109. The numerical designators for the power supply potentials may not be shown for each device, in some cases just the circuit symbols for the potentials are shown.

The power-gated logic stage comprising PFET 910 and NFET 911 is an inverting stage. The positive voltage potential 108 is coupled to the source of PFET 910 and the ground potential 109 is coupled to the source of NFET 911 via NFET 912. If the gate 901 of PFET 910 is a logic one (H), the logic one on gate 902 of NFET 912 will assert a logic zero (L) at node 904 coupling the gate of PFET 913. When the gate 902 of NFET 912 transitions from a logic one to a logic zero, the ground potential 109 is decoupled from NFET 911 and the conduction path asserting the logic zero at node 904 is opened. Leakage current will cause the logic zero on node 904 to become a collapsing logic zero (L↑) wherein the logic zero state will "float" upwards toward a logic one thus turning OFF PFET 913. If the gate 903 of NFET 914 is a logic zero, then NFET 914 is OFF. When node 904 is a logic zero, a logic one is asserted on node 908. As the logic zero on node 904 collapses (L↑), node 908 transitions from its asserted logic one state to a collapsing logic one (H↓). Thus, the collapsing logic zero has propagated to a collapsing logic one (H↓). If the gate 905 of PFET 906 is a logic one, then the asserted logic one on node 908 turns ON NFET 907 asserting a logic zero on node 909. When the logic one on node 908 collapses (H↓), node 908 floats "down" turning OFF NFET 907 causing the asserted logic zero on node 909 to become a collapsing logic zero (L↑). The collapsing logic zero (L↑) of node 904 has propagated through two stages in response to the logic one-to-logic zero transition on gate 902 of NFET 912. This process generates delays from the logic transition on gate 902 of NFET 912 to the corresponding collapsing logic states propagating to nodes 904, 908 and 909, wherein the collapsing logic zero (L↑) at node 909 would incur the most delay.

Figure 10:
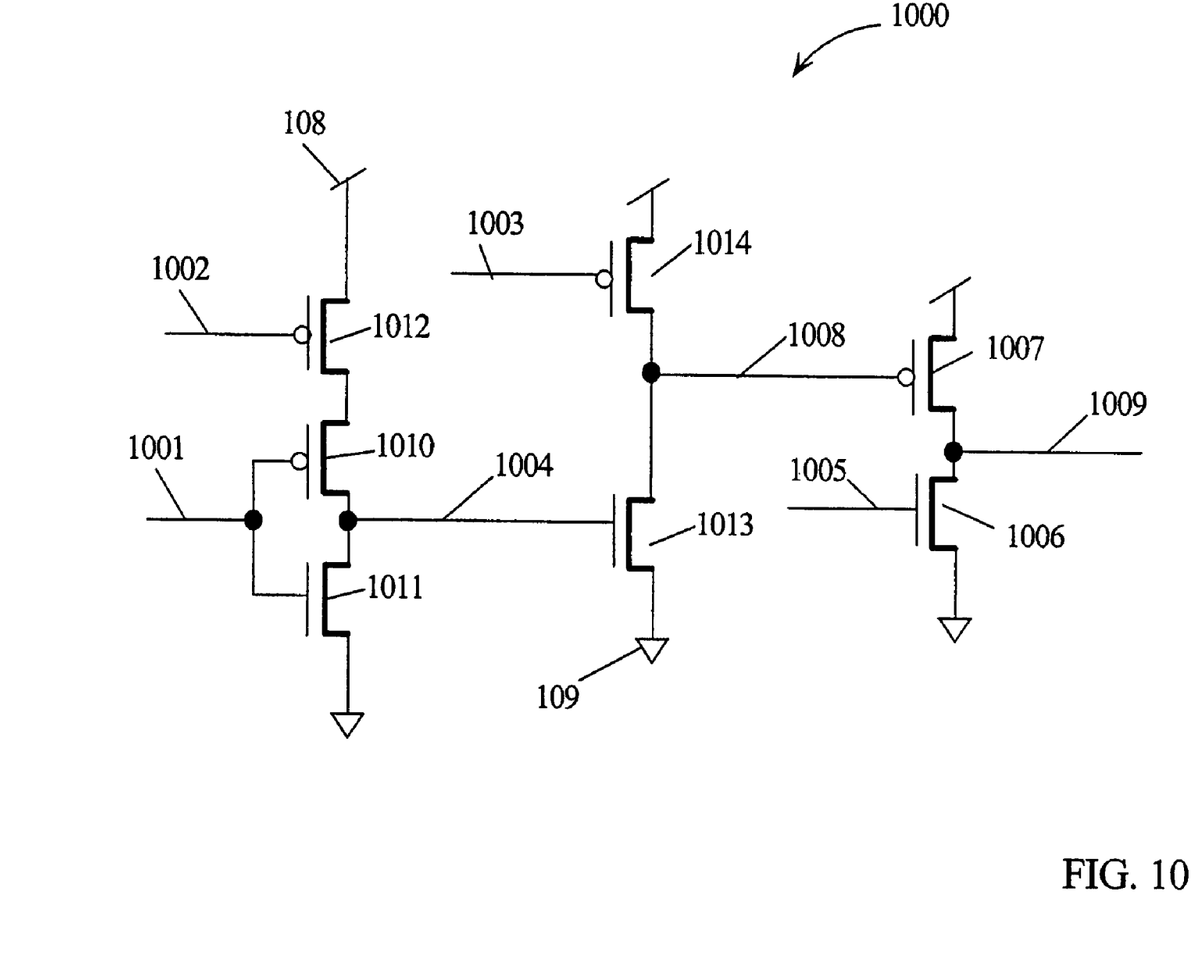
FIG. 10 is a circuit diagram of a high leakage logic path for propagating collapsing floating states according to another embodiment of the present invention.

FIG. 10 is a circuit diagram of circuitry 1000 for propagating collapsing states according to embodiments of the present invention. The devices are powered by the positive voltage potential 108 and the ground potential 109. The numerical designators for the power supply potentials may not be shown for each device, in some cases just the circuit symbols for the potentials are shown.

The power-gated logic stage comprising PFET 1010 and NFET 1011 is an inverting stage. The positive voltage potential 108 is coupled to the source of PFET 1010 via PFET 1012 and the ground potential 109 is coupled to the source of NFET 1011. If the node 1001 is a logic zero (L), the logic zero on gate 1002 of PFET 1012 will assert a logic one (H) at node 1004 coupled to the gate of NFET 1013. When the gate 1002 of PFET 1012 transitions from a logic zero to a logic one (H) the positive voltage potential 108 is decoupled from PFET 1010 and the conduction path asserting the logic one at node 1004 is opened. Leakage current will cause the logic one on node 1004 to become a collapsing logic one (H↑) wherein the logic one state will "float" downwards towards a logic zero thus turning OFF NFET 1013. If the gate 1003 of PFET 1014 is a logic one, then PFET 1014 is OFF. When node 1004 was a logic one, a logic zero was asserted on node 1008. As the logic one on node 1004 collapses (H↓), node 1008 transitions from its asserted logic zero state to a collapsing logic zero (L↑). Thus, the collapsing logic one has propagated to a collapsing logic zero. If the gate 1005 of NFET 1006 is a logic zero, then the asserted logic zero on node 1008 turns PFET 1007 ON asserting a logic one on node 1009. When the logic zero on node 1008 collapses (L↑), node 1008 floats "up" turning OFF PFET 1007 causing the asserted logic one on node 1009 to become a collapsing logic one (H↓). The collapsing logic one (H↓) of node 1004 has propagated through two stages in response to the logic zero to logic one transition on gate 1002 of PFET 1012. This process generates delays from the logic transition on gate 1002 of PFET 1012 to the corresponding collapsing logic states propagating to nodes 1004, 1008 and 1009, wherein the collapsing logic one (H↓) at node 1009 would incur the most delay.

Figure 11:
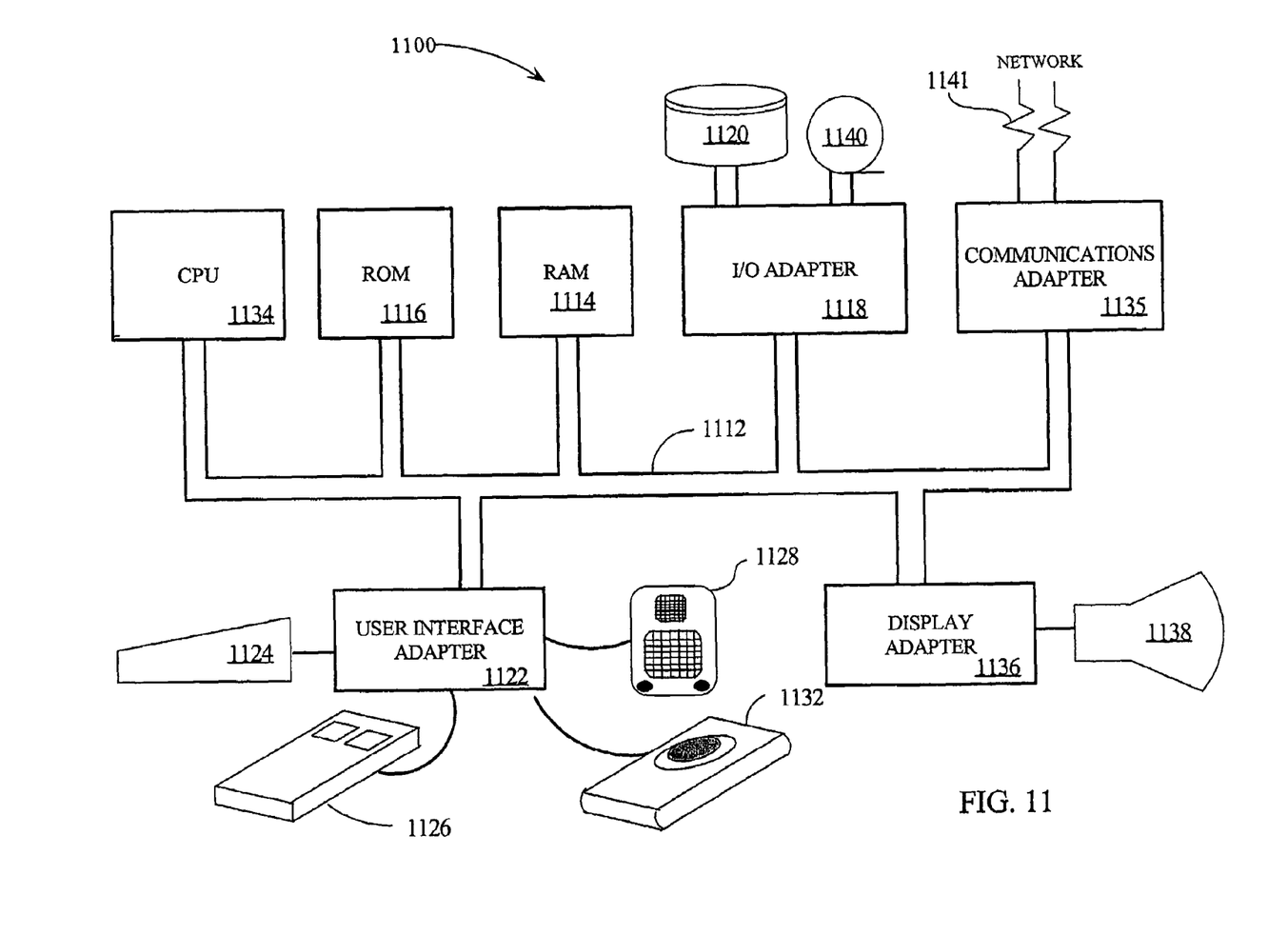
FIG. 11 is a block diagram of a data processing system suitable for practicing embodiments of the present invention.

FIG. 11 is a high level functional block diagram of a representative data processing system 1100 suitable for practicing the principles of the present invention. Data processing system 1100 includes a central processing system (CPU) 1110 operating in conjunction with a system bus 1112. System bus 1112 operates in accordance with a standard bus protocol, such as the ISA protocol, compatible with CPU 1110. CPU 1110 operates in conjunction with elec- tronically erasable programmable read-only memory (EE- PROM) 1116 and random access memory (RAM) 1114. Among other things, EEPROM 1116 supports storage of the Basic Input Output System (BIOS) data and recovery code. RAM 1114 includes, DRAM (Dynamic Random Access Memory) system memory and SRAM (Static Random Access Memory) external cache. I/O Adapter 1118 allows for an interconnection between the devices on system bus 1112 and external peripherals, such as mass storage devices (e.g., a hard drive, floppy drive or CD/ROM drive), or a printer 1140. A peripheral device 1120 is, for example, coupled to a peripheral control interface (PCI) bus, and I/O adapter 1118 therefore may be a PCI bus bridge. User interface adapter 1122 couples various user input devices, such as a keyboard 1124 or mouse 1126 to the processing devices on bus 1112. Display 1138 which may be, for example, a cathode ray tube (CRT), liquid crystal display (LCD) or similar conventional display units. Display adapter 1136 may include, among other things, a conventional display controller and frame buffer memory. Data processing system 1100 may be selectively coupled to a computer or telecommunications network 1141 through communications adapter 1134. Communications adapter 1134 may include, for example, a modem for connection to a telecom network and/or hardware and software for connecting to a computer network such as a local area network (LAN) or a wide area network (WAN). CPU 1110 and other components of data processing system 1100 may contain low leakage logic circuitry that is controlled with propagating collapsing logic states according to embodiments of the present invention to control gate-leakage currents.

Although the present invention and its advantages have been described in detail, it should be understood that various changes, substitutions and alterations can be made herein without departing from the spirit and scope of the invention as defined by the appended claims.

What is claimed is:

1. A reduced leakage logic circuit having a logic input and a logic output comprising:
    a low leakage logic path having an input coupled to the logic input, a first logic node, a second logic node, and a holding output coupled to the logic output;
    a first high leakage logic path having a first power-gated stage with an input coupled to the first logic node and an output coupled to a first stage node and a first logic stage having an input coupled to the first stage node, a control input coupled to the second logic node and an output coupled to a second stage node, wherein a first voltage potential is coupled to the first power-gated stage in response to a first logic state coupled from the logic output and decoupled from the first power-gated stage in response to a second logic state of the logic output to propagate a collapsing logic state from the first stage node to the second stage node; and
    a first driver stage having an input coupled to the second stage node and an output that enhances a current drive capability of the logic output during the second logic state generated in response to an asserted second logic state at the second logic node and an asserted second logic state at the first stage node, wherein a collapsing first logic state on the second stage node disables the first driver stage a delayed time period after an assertion of the second logic state on the logic output.

2. The logic circuit of claim 1 further comprising:
    a second high leakage logic path having a second power-gated stage with an input coupled to the first logic node and an output coupled to a first stage node and a first logic stage having an input coupled to the first stage node, a control input coupled to the second logic node and an output coupled to a second stage node, wherein a second voltage potential is coupled to the second power-gated stage in response to the second logic state coupled from the logic output and decoupled from the second power-gated stage in response to the first logic state of the logic output to propagate a collapsing logic state from the first stage node to the second stage node; and
    a second driver stage having an input coupled to the second stage node and an output that enhances a current drive capability of the logic output during the first logic state generated in response to an asserted first logic state at the second logic node and an asserted first logic state at the first stage node, wherein a collapsing second logic state on the second stage node disables the second driver stage a delayed time period after an assertion of the first logic state on the logic output.

3. The logic circuitry of claim 2, wherein the second logic state is coupled from the logic output to the first power-gated stage through an even number of inverting logic stages.

4. The logic circuitry of claim 3, wherein the first logic state is coupled from the logic output to the second power-gated stage through the even number of inverting logic stages.

5. The logic circuitry of claim 1, wherein the first power-gated stage comprises a power-gated inverting stage having a first power node coupled to the first voltage potential with an electronic switch, a second power node coupled to a second voltage potential, the input coupled to the logic input and the output coupled to the first stage node.

6. The logic circuitry of claim 2, wherein the first logic stage comprises an inverting logic stage having a first input coupled to the first stage node, a second input coupled as the control input and an output coupled to the second stage node, wherein a logic zero is asserted at the second stage node in response to a first logic combination of the first and second inputs, a logic one is asserted at the second stage node in response to a second logic combination of the first and second inputs, and a the second stage node transitions to a collapsing second logic state in response to the first logic state at the second input and a collapsing first logic state at the first input.

7. The logic circuitry of claim 2, wherein the second power-gated stage comprises a power-gated inverting stage having a first power node coupled to the second voltage potential with an electronic switch, a second power node coupled to the second voltage potential, the input coupled to the logic input and the output coupled to the first stage node.

8. The logic circuitry of claim 5, wherein in the power-gated stage comprises:
    an N-channel field effect transistor (NFET) having a source terminal coupled to the second voltage potential, a gate terminal coupled to the first logic node, and a drain terminal;
    a first PFET having a gate terminal coupled to the first logic node, a drain terminal coupled to the drain terminal of the NFET, and a source terminal; and
    a second PFET having a drain terminal coupled to the source terminal of the first PFET, a gate terminal coupled to the logic output, and a source terminal coupled to the first voltage potential.

9. The logic circuitry of claim 7, wherein in the power-gated stage comprises:
    a PFET having a source terminal coupled to the first voltage potential, a gate terminal coupled to the first logic node, and a drain terminal;

a first NFET having a gate terminal coupled to the first logic node, a drain terminal coupled to the drain terminal of the PFET, and a source terminal; and a second NFET having a drain terminal coupled to the source terminal of the first NFET, a gate terminal coupled to the logic output, and a source terminal coupled to the second voltage potential.

10. The logic circuitry of claim 1, wherein in the low leakage path comprises an even number of logic inverter stages.

11. The logic circuitry of claim 1, wherein in the low leakage path comprises an odd number of logic inverter stages.

12. The logic circuitry of claim 1, wherein the first driver stage comprises a PFET having a source terminal coupled to the first voltage potential, a gate terminal coupled to the second stage node of the first high leakage path and a drain terminal coupled to the logic output.

13. The logic circuitry of claim 2, wherein the second driver stage comprises an NFET having a source terminal coupled to the second voltage potential, a gate terminal coupled to the second stage node of the second high leakage path and a drain terminal coupled to the logic output.

14. A data processing system comprising:

a central processing unit (CPU) configured as one or more integrated circuits having a reduced leakage logic circuit with a logic input, a logic output and a low leakage logic path having an input coupled to the logic input, a first logic node, a second logic node, and a holding output coupled to the logic output, a first high leakage logic path having a first power-gated stage with an input coupled to the first logic node and an output coupled to a first stage node and a first logic stage having an input coupled to the first stage node, a control input coupled to the second logic node and an output coupled to a second stage node, wherein a first voltage potential is coupled to the first power-gated stage in response to a first logic state coupled from the logic output and decoupled from the first power-gated stage in response to a second logic state of the logic output to propagate a collapsing logic state from the first stage node to the second stage node, and a first driver stage having an input coupled to the second stage node and an output that enhances a current drive capability of the logic output during the second logic state generated in response to an asserted second logic state at the second logic node and an asserted second logic state at the first stage node, wherein a collapsing first logic state on the second stage node disables the first driver stage a delayed time period after an assertion of the second logic state on the logic output.

15. The data processing system of claim 14, wherein the reduced leakage logic circuit further comprises;

a second high leakage logic path having a second power-gated stage with an input coupled to the first logic node and an output coupled to a first stage node and a first logic stage having an input coupled to the first stage node, a control input coupled to the second logic node and an output coupled to a second stage node, wherein a second voltage potential is coupled to the second power-gated stage in response to the second logic state coupled from the logic output and decoupled from the second power-gated stage in response to the first logic state of the logic output to propagate a collapsing logic state from the first stage node to the second stage node; and a second driver stage having an input coupled to the second stage node and an output that enhances a current drive capability of the logic output during the first logic state generated in response to an asserted first logic state at the second logic node and an asserted first logic state at the first stage node, wherein a collapsing second logic state on the second stage node disables the second driver stage a delayed time period after an assertion of the first logic state on the logic output.

16. The data processing system of claim 15, wherein the second logic state is coupled from the logic output to the first power-gated stage through an even number of inverting logic stages.

17. The data processing system of claim 16, wherein the first logic state is coupled from the logic output to the second power-gated stage through the even number of inverting logic stages.

18. The data processing system of claim 14, wherein the first power-gated stage comprises a power-gated inverting stage having a first power node coupled to the first voltage potential with an electronic switch, a second power node coupled to a second voltage potential, the input coupled to the logic input and the output coupled to the first stage node.

19. The data processing system of claim 15, wherein the first logic stage comprises an inverting logic stage having a first input coupled to the first stage node, a second input coupled as the control input and an output coupled to the second stage node, wherein a logic zero is asserted at the second stage node in response to a first logic combination of the first and second inputs, a logic one is asserted at the second stage node in response to a second logic combination of the first and second inputs, and a the second stage node transitions to a collapsing second logic state in response to the first logic state at the second input and a collapsing first logic state at the first input.

20. The data processing system of claim 15, wherein the second power-gated stage comprises a power-gated inverting stage having a first power node coupled to the second voltage potential with an electronic switch, a second power node coupled to the second voltage potential, the input coupled to the logic input and the output coupled to the first stage node.

* * * * *